(12) United States Patent
Griffin et al.

(10) Patent No.: US 8,304,014 B2
(45) Date of Patent: Nov. 6, 2012

(54) ALIGNING OLED SUBSTRATES TO A SHADOW MASK

(75) Inventors: Todd R. Griffin, Webster, NY (US); Thomas W. Palone, Rochester, NY (US)

(73) Assignee: Global OLED Technology LLC, Herndon, VA (US)

(*) Notice: Subject to any disclaimer, the term of this patent is extended or adjusted under 35 U.S.C. 154(b) by 1160 days.

(21) Appl. No.: 11/351,153

(22) Filed: Feb. 9, 2006

(65) Prior Publication Data

US 2007/0184745 A1 Aug. 9, 2007

(51) Int. Cl.
- B05D 5/06 (2006.01)
- B05D 1/32 (2006.01)
- C23C 16/00 (2006.01)

(52) U.S. Cl. ............. 427/66; 427/69; 427/282; 118/721

(58) Field of Classification Search .................. 118/721; 313/504; 427/66, 69, 70, 282; 428/917; 445/24

See application file for complete search history.

(56) References Cited

U.S. PATENT DOCUMENTS

| 4,511,599 | A | * | 4/1985 | Rustomji ................. 427/66 |
| 4,599,970 | A | * | 7/1986 | Peterson ................. 118/504 |
| 4,676,193 | A | * | 6/1987 | Martin ................. 118/720 |
| 4,915,057 | A |   | 4/1990 | Boudreau et al. |
| 6,729,927 | B2 |   | 5/2004 | Stagnitto et al. |
| 2001/0017518 | A1 | * | 8/2001 | Mizutani et al. ........ 313/504 |
| 2003/0017259 | A1 | * | 1/2003 | Yamada et al. ........ 427/66 |
| 2004/0020435 | A1 | * | 2/2004 | Tsuchiya et al. ........ 118/723 VE |
| 2004/0021410 | A1 | * | 2/2004 | Stagnitto et al. ........ 313/407 |
| 2006/0150910 | A1 | * | 7/2006 | Han et al. ........ 118/721 |

* cited by examiner

*Primary Examiner* — James Lin
(74) *Attorney, Agent, or Firm* — Morgan, Lewis & Bockius LLP

(57) ABSTRACT

A method of aligning an OLED substrate with a shadow mask includes forming a shadow mask with at least three spaced alignment openings, providing a precision alignment element into each of the alignment openings, and positioning the OLED substrate so that the edges of the OLED substrate engage the precision alignment elements and thereby align the shadow mask with the OLED substrate.

1 Claim, 3 Drawing Sheets

US 8,304,014 B2

ALIGNING OLED SUBSTRATES TO A SHADOW MASK

FIELD OF THE INVENTION

This invention relates to patterned physical vapor deposition. More specifically, this invention relates to providing precision alignment between an OLED substrate and a shadow mask.

BACKGROUND OF THE INVENTION

Physical vapor deposition (PVD) is a useful technique for producing thin films, enabling the fabrication of devices such as organic light emitting diodes (OLEDs) and photovoltaic devices ("solar cells"). Shadow masks are used to pattern the thin films during the deposition process. In general, there is a need for precision alignment between the various layers deposited in the fabrication of complex, layered structures such as OLEDs.

Existing methods for aligning a shadow mask to a substrate are generally divided into two categories, active and passive. In an active approach a sensing system, generally a computer vision system, is used to determine the relative position error between the shadow mask and the substrate. Visible fiducials are provided on the shadow mask and the substrate, and then the position error is measured by computing the distance and direction between a pair of corresponding fiducials. A precision motion system is then employed to reposition the mask or the substrate in order to reduce or remove the error. Active alignment systems tend to be fairly expensive due to the cost of the computer vision system, and can be somewhat slow due to the requirements for highly precise motion mechanisms to correct errors. U.S. Pat. No. 6,729,927 describes the use of computer vision for aligning shadow masks to a frame.

Passive alignment generally relies on kinematic constraint to produce the desired relative positioning. U.S. Pat. No. 4,915,057 is typical of this approach. In this passive system a frame is used to hold the shadow mask. A set of alignment holes in the shadow mask frame is mated to corresponding pins in an alignment frame. The substrate is likewise mounted in a frame with alignment holes, which are then mated to a different set of pins in the alignment plate. (The method of U.S. Pat. No. 4,915,057 actually requires additional alignment steps in which the mask is aligned to the mask frame. Likewise, the substrate should be aligned to the substrate frame.) This passive alignment process can be faster than active alignment, but suffers from what is known as tolerance stack-up. Since there are no perfect alignment features and holes, and no perfect placements, each stage of contact or offset in passive alignment introduces a new source of tolerance stack-up. Although these effects can be reduced to very low levels, this requires expensive fabrication techniques.

SUMMARY OF THE INVENTION

An object of the present invention is that it precisely aligns an OLED substrate to the shadow mask, thereby limiting the problems associating with aligning the shadow mask to the OLED device.

This object is achieved by a method of aligning an OLED substrate with a shadow mask, comprising:

a) forming a shadow mask with at least three spaced alignment openings;

b) providing a precision alignment element into each of the alignment openings; and c) positioning the OLED substrate so that the edges of the OLED substrate engage the precision alignment elements and thereby align the shadow mask with the OLED substrate.

ADVANTAGES

The shadow mask alignment method by aligning the OLED substrate to the shadow mask can be completely passive in that an optical alignment system is not necessary. Another feature of the invention is that, in comparison to existing passive alignment arrangements, a high degree of precision can be achieved.

DETAILED DESCRIPTION OF THE INVENTION

Figure 1:
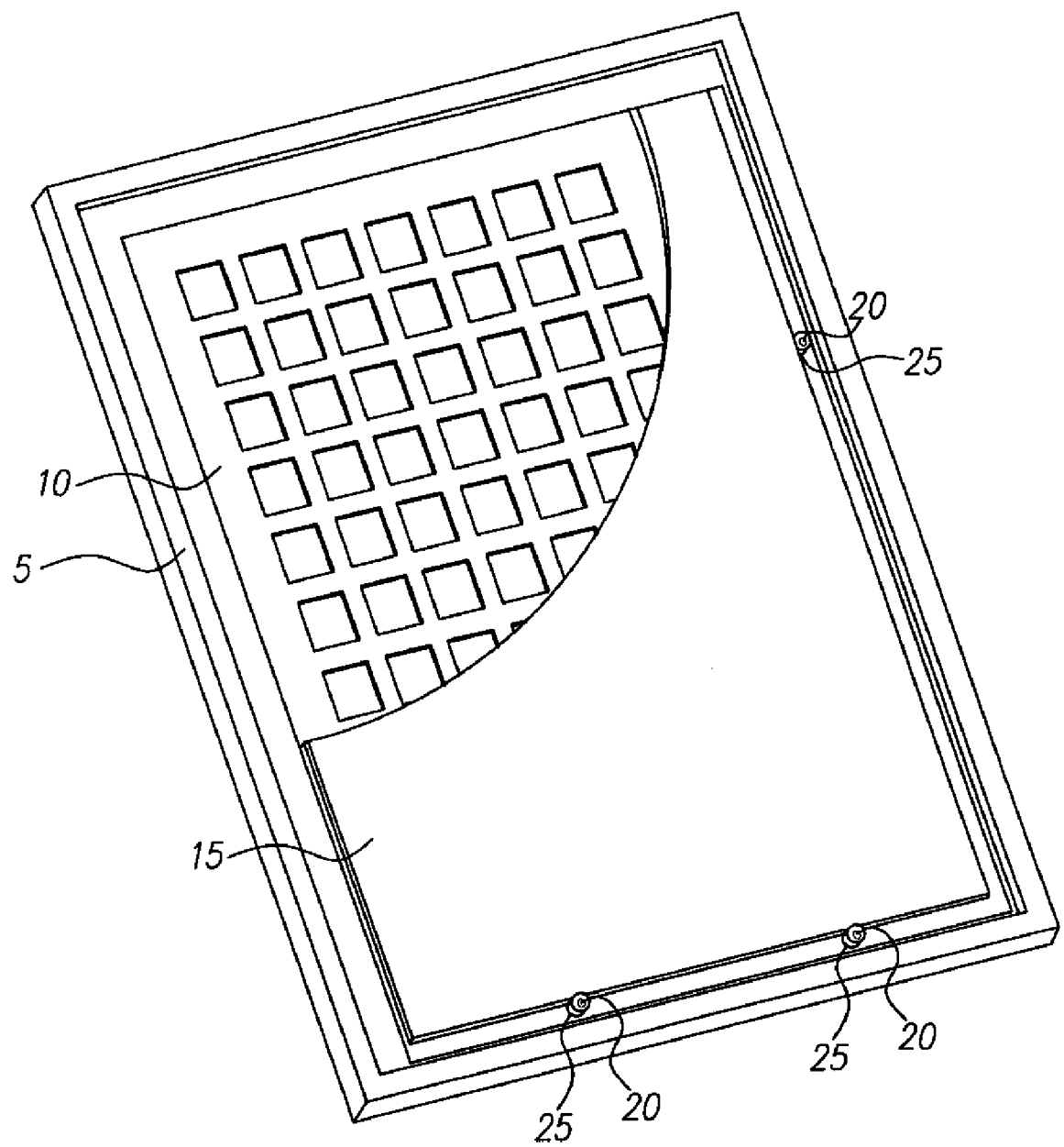
FIG. 1 is a perspective of an aligned OLED structure with a shadow mask in accordance with the present invention.

Referring to FIG. 1, a frame 5 contains a shadow mask 10 which is preferably in an already tensioned state. Shadow mask 10 contains a plurality of spaced alignment openings 25. The alignment openings are holes in the shadow mask itself. Precision alignment elements 20 are inserted into alignment openings 25 and are secured in place. The alignment elements shown are hardened cylindrical pins that have precise dimensions. Substrate 15 is shown in position above the shadow mask (the substrate is shown in cutaway to reveal the shadow mask below it.) After securing all alignment elements, the edges of the substrate are aligned to the shadow mask by placing them in contact with the precision alignment elements 20. By using passive alignment, the alignment is achieved quickly and at low cost. By referencing both the shadow mask and the substrate to the same set of alignment elements, one level of tolerance stack-up is removed, resulting in a more accurate alignment.

FIG. 1 illustrates a configuration of alignment elements that provide complete kinematic constraint that provides the highest possible level of location precision. It is possible to provide additional alignment elements and openings which would provide redundant constraint. For example, one can provide two alignment elements and openings on each side of a rectangular mask and rectangular substrate. Although this is over-constrained and decreases the accuracy of the placement, it can speed up the placement and simplify or cost-reduce the placement equipment when the over-constrained configuration provides adequate precision.

Figure 2:
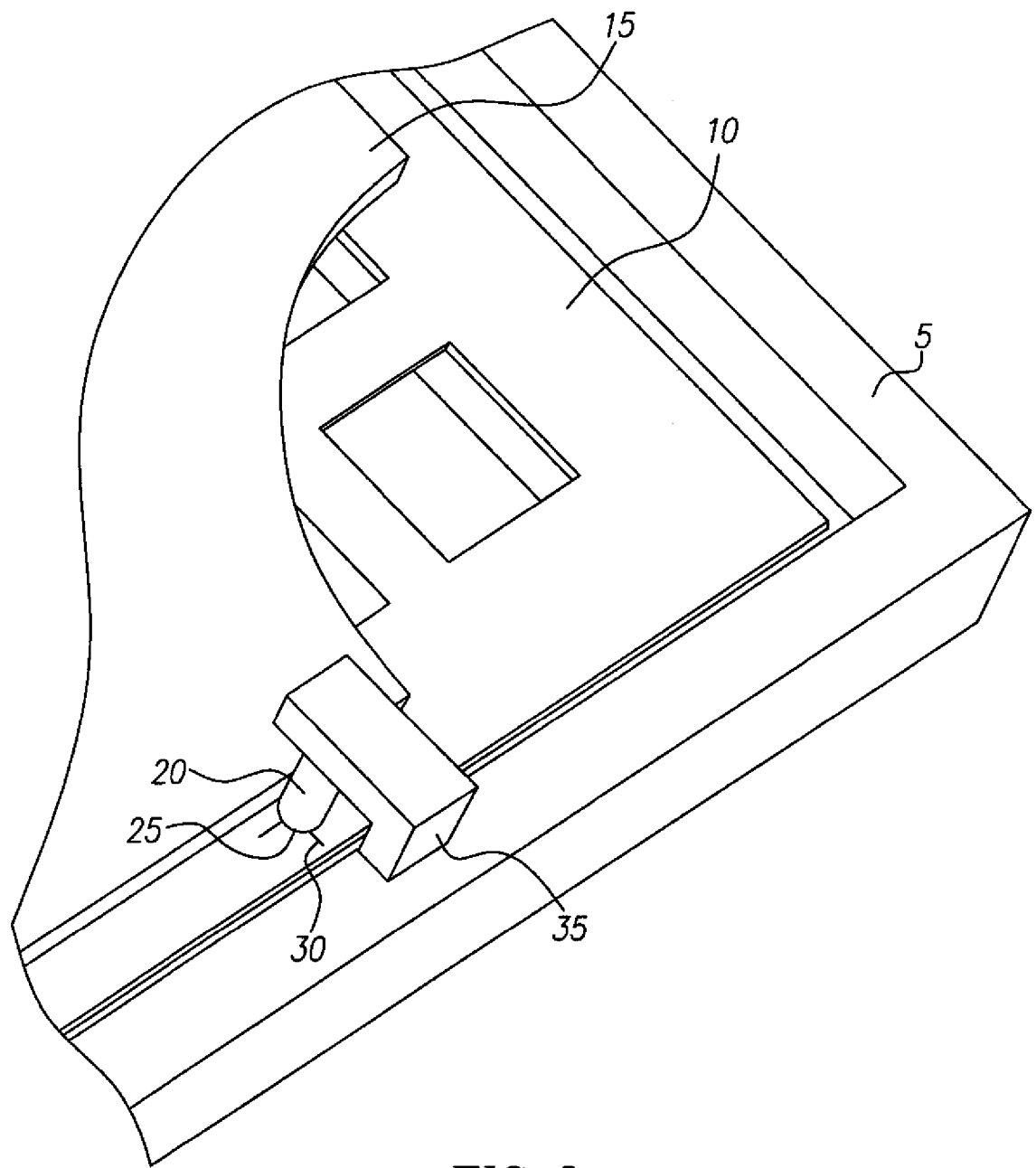
FIG. 2 is a detailed broken away view of a portion of FIG. 1 showing a clamping arrangement in accordance with the present invention.

FIG. 2 is a close-up view showing a precision alignment element 20 represented here as a hardened cylindrical pin, inserted into alignment opening 25 which is a slitted hole in the shadow mask itself. The slits 30 permit the holes to be fabricated slightly undersize compared to the hardened cylindrical pins. This arrangement of slitted, undersized holes permits the hardened cylindrical pins to be placed through the holes without ripping or tearing the shadow mask and to self-center in the hole. The hardened cylindrical pin is held in place, at least temporarily, by the spring force of the shadow mask. After the pin has been inserted it can be clamped in place by a finger clamp 35, which rigidly holds the pin in a fixed location, yet in precise positional alignment with the shadow mask apertures. This arrangement permits the alignment element to be placed in precise relationship to the shadow mask, further limiting another source of tolerance stack-up. After the alignment elements are clamped in place, the substrate 15 is brought into alignment by bringing the edges of the substrate into contact with the alignment elements (the hardened cylindrical pins).

Figure 3:
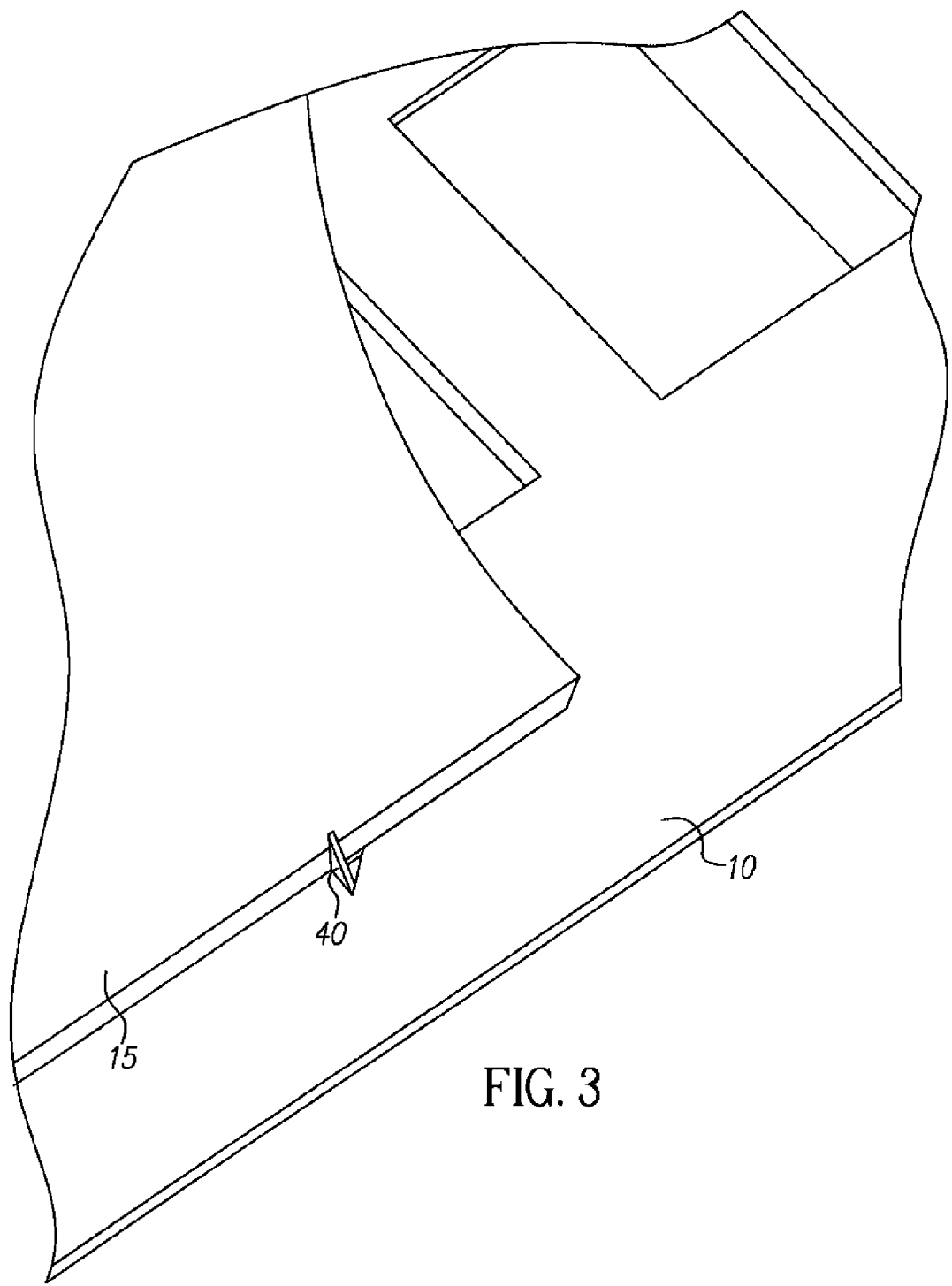
FIG. 3 is a detail view of an alternative embodiment using integral shadow mask alignment portions.

FIG. 3 illustrates another embodiment of the invention. The shadow mask 10 contains a plurality of integral alignment portions 40, although only one is shown for drawing simplification. In the figure, the integral alignment portions 40 are formed by bending up small tabs integrated into the design of the shadow mask. By forming the integral alignment portions 40 in the shadow mask, most preferably at the same time the shadow mask aperture pattern is formed, the greatest relative accuracy between the shadow mask aperture pattern and the substrate 15 is achieved at the lowest cost. Integral alignment portions 40 remove one more level of tolerance stack-up compared to non-integral alignment elements. Although the integral alignment portions 40 are shown to be constructed and oriented in such a way that they provide a high amount of rigidity considering the thinness of the shadow mask, it is obvious to one of ordinary skill in the art that additional mechanical structures can be added to give integral alignment portions 40 more strength and rigidity.

Although the alignment elements are shown in this arrangement as hardened cylindrical pins and the alignment openings as corresponding holes, there are numerous other alignment elements and alignment openings suitable for the passive alignment of this invention that are well known to those of ordinary skill in the art.

The described embodiments do not describe the method of forming the shadow mask because the invention is applicable independent of how the shadow mask was produced, including such methods as etching, electro-forming, stamping, and laser-cutting.

The described embodiments do not describe the orientation of the components with respect to gravity because the applicability of the invention is independent of the orientation. It is obvious to one of ordinary skill in the art that depending upon orientation, additional clamping elements can be required to maintain the contacts between the alignment elements and the alignment openings. Such clamping elements and their configuration are well known to practitioners in the art.

The invention has been described in detail with particular reference to certain preferred embodiments thereof, but it will be understood that variations and modifications can be effected within the spirit and scope of the invention.

PARTS LIST

5 frame
10 shadow mask
15 substrate
20 precision alignment element
25 alignment opening
30 slit
35 clamp
40 integral alignment portion

The invention claimed is:

1. A method of aligning an OLED substrate with a shadow mask, comprising:
   a) forming a shadow mask with at least three spaced alignment openings and placing such shadow mask under tension into a frame;
   b) providing a precision alignment element into each of the alignment openings;
   c) securing each precision alignment element to the frame; and
   d) positioning the OLED substrate so that a portion of the edges of the OLED substrate engage the precision alignment elements and thereby align the shadow mask in the frame with the OLED substrate.

* * * * *